United States Patent
Yamamoto et al.

(10) Patent No.: US 6,666,752 B1
(45) Date of Patent: Dec. 23, 2003

(54) WAFER RETAINER AND METHOD FOR ATTACHING/DETACHING THE WAFER RETAINER TO/FROM POLISHING MACHINE BASE PLATE

(75) Inventors: Masayoshi Yamamoto, Nara (JP); Toshiaki Kasazaki, Nara (JP); Naoyuki Tani, Nara (JP); Shinichiro Kawahara, Nara (JP); Takashi Ando, Nara (JP)

(73) Assignee: Nitta Corporation, Osaka (JP)

( * ) Notice: Subject to any disclaimer, the term of this patent is extended or adjusted under 35 U.S.C. 154(b) by 0 days.

(21) Appl. No.: 09/786,008

(22) PCT Filed: Aug. 27, 1999

(86) PCT No.: PCT/JP99/04661
§ 371 (c)(1),
(2), (4) Date: Jun. 4, 2001

(87) PCT Pub. No.: WO00/12643
PCT Pub. Date: Mar. 9, 2000

(30) Foreign Application Priority Data

Aug. 28, 1998 (JP) ............................................ 10-244106

(51) Int. Cl.⁷ ................................................ B24B 1/00
(52) U.S. Cl. ......................... 451/41; 451/533; 451/537; 451/538
(58) Field of Search ...................... 451/41, 533, 537, 451/538

(56) References Cited

U.S. PATENT DOCUMENTS

| 4,512,113 | A | | 4/1985 | Budinger ................ 51/236 |
| 5,624,304 | A | * | 4/1997 | Pasch et al. |
| 6,190,746 | B1 | * | 2/2001 | Ishii et al. |

FOREIGN PATENT DOCUMENTS

| EP | 0 588 180 | 3/1994 | .............. C09J/7/02 |
| JP | 06-510548 | 11/1994 | .......... C09J/151/00 |
| JP | 10-163135 | 6/1998 | ......... H01L/21/301 |
| WO | WO 92/13901 | 8/1992 | ............. C08F/8/00 |
| WO | WO 96/30163 | 10/1996 | ........... B24B/37/04 |
| WO | WO 00/12642 | 3/2000 | .............. C09J/7/02 |
| WO | WO 00/17284 | 3/2000 | .............. C09J/7/02 |

OTHER PUBLICATIONS

S.M. Aharoni, "Rigid Backbone Polymers. 2. Polyisocyanates and Their Liquid–Crystal Behavior," *Macromolecules*, 12, pp. 94–103 (1979).

F. Andruzzi et al., "Studies on Comb–Like Polymers. 2. Poly(octadecylethylene oxide)," *Macromolecules*, 13, pp. 15–18 (1980).

(List continued on next page.)

*Primary Examiner*—Joseph J. Hail, III
*Assistant Examiner*—Willie Berry, Jr.
(74) *Attorney, Agent, or Firm*—Fish & Neave; James F. Haley, Jr.; Nina R. Horan (57) ABSTRACT

A wafer retainer includes: a foam layer capable of adsorbing a wafer on a surface thereof in a detachable manner; a first pressure-sensitive adhesive layer formed on a back face of the foam layer; a support formed on a back face of the first pressure-sensitive adhesive layer; a second pressure-sensitive adhesive layer formed on a back face of the support for adhering to a base plate of a polishing machine; and a release sheet releasably attached to the second pressure-sensitive adhesive layer. The second pressure-sensitive adhesive layer includes an adhesive composition. The adhesive composition contains a pressure-sensitive adhesive and a side-chain crystallizable polymer so that the side-chain crystallizable polymer is present in an amount of about 1% to about 30% by weight based on the adhesive composition. The side-chain crystallizable polymer includes as a main component thereof an acrylic acid ester and/or methacrylic acid ester which has a straight-chain alkyl group including 16 or more carbon atoms as a side-chain.

2 Claims, 5 Drawing Sheets

OTHER PUBLICATIONS

J.I. González de la Campa et al., "Side–Chain Crystallinity, Heat of Melting, and Thermal Transitions in Poly [N–(10–n–Alkyloxycarbonyl–n–Decyl) Maleimides] (PEMI)," *Journal of Polymer Science*, 18, pp. 2197–2207 (1980).

V.V. Chupov et al., "Structure and Physico–Chemical Properties of Comb–Like Polypeptides based on Poly–L–Lysine," *Polymer Science U.S.S.R.*, 21, pp. 241–252 (1979).

S.A. Greenberg and T. Alfrey, "Side Chain Crystallization of n–Alkyl Polymethacrylates and Polyacrylates," *Journal of the American Chemical Society*, 76, pp. 6280–6285 (1955).

E.F. Jordan, Jr. et al., "Side–Chain Crystallinity. I. Heats of Fusion and Melting Transitions on Selected Homopolymers Having Long Side Chains," *Journal of Polymer Science*, 9, pp. 1835–1851 (1971).

E.F. Jordan, Jr. et al., "Side–Chain Crystallinity. II. Heats of Fusion and Melting Transitions on Selected Copolymers Incorporating n–Octadecyl Acrylate or Vinyl Stearate," *Journal of Polymer Science*, 9, pp. 3349–3365 (1971).

E.F. Jordan, Jr., "Side–Chain Crystallinity. III. Influence of Side–Chain Crystallinity on the Glass Transition Temperatures of Selected Copolymers Incorporating n–Octadecyl Acrylate or Vinyl Stearate," *Journal of Polymer Science*, 9, pp. 3367–3378 (1971).

E.F. Jordan, Jr. et al., "Side–Chain Crystallinity. IV. Mechanical Properties and Transition Temperatures of Copolymers of Methyl Methacrylate with Higher n–Alkyl Acrylates and N–n–Alkylacrylamides," *Journal of Polymer Science*, 10, pp. 1657–1679 (1972).

E.F. Jordan, Jr., "Side–Chain Crystallinity. V. Heats of Fusion and Melting Temperatures on Monomers Whose Homopolymers Have Long Side Chains," *Journal of Polymer Science*, 10, pp. 3347–3366 (1972).

P.L. Magagnini et al., "Studies on Comb–Like Polymers. 1. Poly(octadecylethylene)," *Macromolecules*, 13, pp. 12–15 (1980).

C.G. Overberger et al., "The Preparation and Polymerization of p–Alkylstyrenes. Effect of Structure on the Transition Temperatures of the Polymers," *Journal of The American Chemical Society*, 75, pp. 3326–3330 (1953).

A.G. Pittman and B.A. Ludwig, "Effect of Polymer Crystallinity on the Wetting Properties of Certain Fluoroalkyl Acrylates," *Journal of Polymer Science*, 7, pp. 3053–3066 (1969).

N.A. Platé and V.P. Shibaev, "Comb–Like Polymers, Structure and Properties," *Journal of Polymer Science: Macromolecular Reviews*, 8, pp. 117–253 (1974).

J.F. Rabolt et al., "Studies of Chain Conformational Kinetics in Poly(di–n–alkylsilanes) by Spectroscopic Methods. 1. Poly(di–n–hexylsilane), Poly(di–n–heptylsilane), and Poly(di–n–octylsilane)," *Macromolecules*, 19, pp. 611–616 (1986).

K. Yokota and T. Hirabayashi, "Widely–Spaced Comb–Like Polymers Having Fluoroalkyl Side Chains," *Polymer Journal*, 17, pp. 991–996 (1985).

* cited by examiner

WAFER RETAINER AND METHOD FOR ATTACHING/DETACHING THE WAFER RETAINER TO/FROM POLISHING MACHINE BASE PLATE

TECHNICAL FIELD

The present invention relates to a wafer retainer which is attached to a base plate of a polishing machine so as to hold a workpiece (e.g., a semiconductor wafer) in place while the workpiece is polished, and a method for attaching/detaching the wafer retainer to/from the base plate of the polishing machine.

BACKGROUND ART

In recent years, in the semiconductor industry, the integration level of ICs has rapidly increased. It has increased from 4 M to 16 M and is now proceeding to the 64 M level.

In light of the above circumstances, improvement in the surface quality of a wafer (on which ICs are formed) has been demanded. In order to increase the integration level of ICs, it is necessary to reduce the minimum width that is allowed for devices to be mounted on the wafer, as well as improving the chemical and electrical properties of the wafer. The ideal value for the minimum width has shifted from about 0.5 microns to about 0.35 microns.

In order to enable such high-precision processing, more and more stringent demands have been made on the flatness or thickness accuracy of the wafer surface. Specifically, a wafer which has been subjected to a final mirror-surface polishing process is required to have a total thickness variation (TTV) on the order of 1 $\mu$m or less over the entire area, and a local thickness variation (LTV) on the order of 0.2 $\mu$m or less over an area of about 20 mm$^2$ (i.e., an area generally defining a single IC chip).

In order to satisfy such accuracy requirements, it is necessary to accurately mount a given wafer to be polished on a base plate of a polishing machine so that the wafer is substantially in parallel with respect to the base plate surface. In general, two conventional methods are used for mounting a wafer on a polishing machine base plate.

One method involves applying a fused wax on the surface of a heated base plate so as to allow the wafer to be fixed on the base plate surface via the applied wax.

According to this method, a wafer is first fixed on the base plate surface to carry out a polishing process; after the polishing process is completed, the base plate is heated again to fuse the wax thereon in order to remove the wafer from the base plate surface; and the wafer is washed with an organic solvent to eliminate the wax.

Although this method can provide a satisfactory small level of thickness variation of polished wafers, it requires one heating/cooling step of the base plate before and after polishing. Thus, this method disadvantageously requires a heating step for causing thermal fusing of wax, and hazardous organic solvents for washing off the wax.

Another method for mounting a wafer on a polishing machine base plate involves the use of a wafer retainer, such that the wafer retainer is previously adhered to an upper base plate of a polishing machine, and a wafer is adsorbed to the surface of the wafer retainer via a liquid such as water. This method facilitates a polishing process in terms of attachment/detachment of a wafer to/from a base plate, and therefore provides high efficiency and is suitable for automation. Such a wafer retainer is usually fixed on a polishing machine upper base plate by using a pressure-sensitive adhesive having high tack strength.

In this mounting method, however, the adhesive layer provided on the back face of the wafer retainer substrate is adhered to the base plate surface so firmly that a tack strength as large as about 2 to 3 kg/inch width exists when the wafer retainer thus attached to the base plate must be detached in a usual manner. In other words, a force up to about 57 kg may be required to detach a wafer retainer from a base plate having a diameter of about 485 mm. Thus, it is very troublesome when a used wafer retainer must be exchanged with a new one.

On the other hand, if a wafer retainer fails to be attached in proper alignment with respect to the base plate, it has been difficult to reposition and reattach the wafer retainer.

DISCLOSURE OF THE INVENTION

A wafer retainer according to the present invention includes: a foam layer capable of adsorbing a wafer on a surface thereof in a detachable manner; a first pressure-sensitive adhesive layer formed on a back face of the foam layer; a support formed on a back face of the first pressure-sensitive adhesive layer; a second pressure-sensitive adhesive layer formed on a back face of the support for adhering to a base plate of a polishing machine; and a release sheet releasably attached to the second pressure-sensitive adhesive layer, wherein the second pressure-sensitive adhesive layer includes an adhesive composition, the adhesive composition containing a pressure-sensitive adhesive and a side-chain crystallizable polymer so that the side-chain crystallizable polymer is present in an amount of about 1% to about 30% by weight based on the adhesive composition, and the side-chain crystallizable polymer including as a main component thereof an acrylic acid ester and/or methacrylic acid ester which has a straight-chain alkyl group including 16 or more carbon atoms as a side chain.

In one embodiment of the invention, the adhesive composition contains a tackifier in an amount of about 10% to about 30% by weight; and adhesiveness of the adhesive composition is decreased by more than about 90% when heated above about 50° C.

In another embodiment of the invention, the side-chain crystallizable polymer has a molecular weight of about 2,000 to about 15,000.

In still another embodiment of the invention, the side-chain crystallizable polymer has a melting point which occurs within a temperature range narrower than about 15° C.

Alternatively, the wafer retainer according to the present invention includes: a wafer retention layer capable of adsorbing a wafer on a surface thereof in a detachable manner; a pressure-sensitive adhesive layer for attaching the wafer retention layer to a base plate of a polishing machine; and a release sheet releasably attached to the pressure-sensitive adhesive layer, wherein the pressure-sensitive adhesive layer includes an adhesive composition, the adhesive composition containing a pressure-sensitive adhesive and a side-chain crystallizable polymer so that the side-chain crystallizable polymer is present in an amount of about 1% to about 30% by weight based on the adhesive composition, and the side-chain crystallizable polymer including as a main component thereof an acrylic acid ester and/or methacrylic acid ester which has a straight-chain alkyl group including 16 or more carbon atoms as a side chain.

In one embodiment of the invention, the adhesive composition contains a tackifier in an amount of about 10% to about 30% by weight; and adhesiveness of the adhesive composition is decreased by more than about 90% when heated above about 50° C.

In another embodiment of the invention, the side-chain crystallizable polymer has a molecular weight of about 2,000 to about 15,000.

In still another embodiment of the invention, the side-chain crystallizable polymer has a melting point which occurs within a temperature range narrower than about 15° C.

In another aspect of the invention, there is provided a method for attaching/detaching any of the above wafer retainers to/from a base plate of a polishing machine, including the steps of: attaching the wafer retainer to the base plate of the polishing machine by allowing the pressure-sensitive adhesive of the wafer retainer to adhere to the base plate surface maintained at temperature T1; and detaching the wafer retainer from the base plate maintained at temperature T2 which is higher than temperature T1.

The present invention provides the following effects.

According to one embodiment of the present invention, a wafer retainer is provided which includes a pressure-sensitive adhesive layer composed essentially of an adhesive composition containing a pressure-sensitive adhesive and a side-chain crystallizable polymer, where the side-chain crystallizable polymer is present in the amount of about 1% to about 30% by weight based on the adhesive composition. The side-chain crystallizable polymer includes as a main component thereof an acrylic acid ester and/or methacrylic acid ester which has a straight-chain alkyl group including 16 or more carbon atoms as a side chain. As a result, the polymer is capable of shifting between a crystal state and an amorphous state in a reversible manner, responsive to a relatively small temperature change from an arbitrarily selected ordinary temperature value; consequently, the polymer exhibits drastic a change in its tackiness to the base plate surface.

Thus, when the wafer retainer is heated to a predetermined elevated temperature (e.g., about 50° C. to about 100° C.), the adhesiveness of the adhesive layer rapidly decreases. Therefore, at the time of exchanging wafer retainers, the base plate and/or the wafer retainer may be heated so as to greatly decrease the adhesiveness of the adhesive layer with respect to the base plate surface, whereby the wafer retainer can be easily peeled off the base plate surface.

In accordance with an embodiment of the invention where the adhesive composition contains a tackifier in the amount of about 10% to about 30% by weight and where the adhesiveness of the adhesive composition is decreased by more than about 90% when heated above about 50° C., a predetermined level of adhesiveness with respect to the base plate surface can be retained at ordinary temperatures, whereas a rapid decrease in adhesion strength can be caused by heating. Thus, a tackifier present in the above-mentioned amount will not substantially influence the temperature sensitivity of the polymer. As a result, the adhesive composition according to the present invention exhibits a sufficient adhesion strength at ordinary temperatures, while maintaining a good balance between the adhesion strength at ordinary temperatures and the peeling force required at elevated temperatures.

Thus, the invention described herein makes possible the advantages of (1) providing a wafer retainer which adheres strongly, stably, and precisely to a base plate of a polishing machine while a wafer or the like is polished with the wafer retainer, and yet allows for easy detachment from the base plate; (2) providing a method for attaching/detaching such a wafer retainer to/from a base plate of a polishing machine; (3) providing a wafer retainer which can be easily repositioned and reattached for proper alignment with respect to a base plate of a polishing machine; and (4) providing a method for attaching/detaching such a wafer retainer to/from a base plate of a polishing machine.

These and other advantages of the present invention will become apparent to those skilled in the art upon reading and understanding the following detailed description with reference to the accompanying figures.

BEST MODES FOR CARRYING OUT THE INVENTION

Figure 2A:
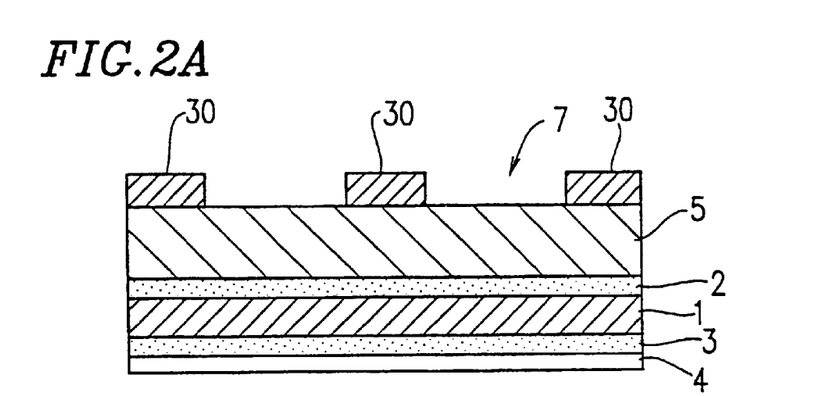
FIG. 2A is a cross-sectional view illustrating a wafer retainer according to one example of the present invention.
Figure 2B:
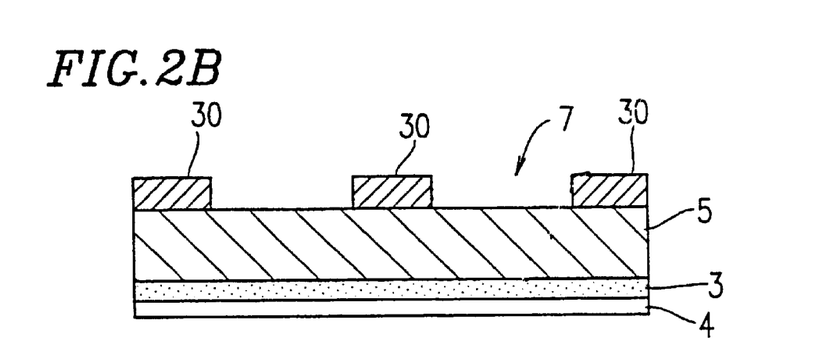
FIG. 2B is a cross-sectional view illustrating a wafer retainer according to another example of the present invention.

Referring to FIG. 2B, the wafer retainer 7 of the present invention at least includes: a foam layer (hereinafter also referred to as a "wafer retention layer") 5 which is capable of adsorbing a wafer on its surface in a detachable manner; a pressure-sensitive adhesive layer 3 for attaching the foam layer 5 on the surface of a base plate of a polishing machine; and a release sheet 4 releasably attached to the pressure-sensitive adhesive layer 3.

The wafer retainer 7 may be composed of three layers as described above, or alternatively may include additional layers. For example, the wafer retainer 7 may have a five-layered structure as shown in FIG. 2A. In this case, the wafer retainer 7 may include a first pressure-sensitive adhesive layer 2 (which can be composed of a commercially available adhesive) formed on one face of a support sheet 1, a wafer retention layer (foam layer) 5 formed on the surface of the first pressure-sensitive adhesive layer 2, a second pressure-sensitive adhesive layer 3 (composed of the inventive pressure-sensitive adhesive) formed on the other face of the support 1, and a release sheet 4 attached on the second pressure-sensitive adhesive layer 3.

As the support sheet 1, various synthetic resin sheets can be used, e.g., polyethylene terephthalate, polyether imide, or polyurethane. For example, a polyester film designated "Lumirror" (manufactured by Toray Industries, Inc.) may be used.

The foam layer (wafer retention layer) 5 may be formed as follows, for example: A foam composition containing urethane polymer, vinyl polymer (such as vinyl chloride polymer, vinyl chloride-vinyl acetate copolymer, and vinyl chloride-vinyl acetate-vinyl alcohol ternary polymer), and a suitable foam solvent such as dimethylformaldehyde may be used to form a foam layer on the above-mentioned support by the wet solidification method. The surface area of the foam layer, especially a skin layer formed on the surface, is preferably subjected to buffing so as to facilitate adsorption of a wafer attached thereon.

Pressure-sensitive Adhesive Layer

The second pressure-sensitive adhesive layer used for the present invention is formed directly or indirectly on the back face of the wafer retention layer. In the case where the second pressure-sensitive adhesive is formed indirectly on the back face of the wafer retention layer, a common pressure-sensitive adhesive layer (first pressure-sensitive adhesive layer) and a support may be interposed between the second pressure-sensitive adhesive layer and the back face of the wafer retention layer.

Examples of pressure-sensitive adhesives contained in the adhesive composition composing the second pressure-sensitive adhesive layer include the following materials: natural rubber adhesives; styrene/butadiene latex-base adhesives; ABA block copolymer type thermoplastic rubbers (where A represents a thermoplastic polystyrene end block; and B represents a rubber intermediate block such as polyisoprene, polybutadiene or poly(ethylene/butylene)); butyl rubber; polyisobutylene; acrylic adhesives such as polyacrylate and vinyl acetate/acryl ester copolymer; and vinylether copolymers such as polyvinylmethylether, polyvinylethylether, and polyvinylisobutylether.

Especially preferable are acryl type pressure-sensitive adhesives composed essentially of ethylhexyl acrylate, hydroxyethyl acrylate, or the like. The use of acryl type pressure-sensitive adhesives provides interaction with the polymer such that the polymer will so be sufficiently dispersed within the adhesive layer at a predetermined temperature so as to exhibit sufficient tackiness, and yet that the-polymer will easily bleed out when heated to a temperature above the predetermined temperature.

Side-chain Crystallizable Polymer

As a side-chain crystallizable polymer to be contained in the adhesive composition, those which have a melting point which occurs within a temperature range narrower than about 15° C. (also referred to as "first-order melting transition") are preferably used. An adhesive composition containing such a polymer is disclosed in Japanese National Phase PCT Laid-open Publication No. 6-510548.

As used herein, the term "melting point" means the temperature at which an equilibrium process causes certain portions of a polymer, initially aligned in an ordered array, to become disordered. In one embodiment, preferably, the melting point of the polymer is in the range of about 40° C. to about 100° C., more preferably in the range of about 40° C. to 60° C. It is preferable that the melting occur rapidly, i.e., over a relatively narrow temperature range which is less than about 10° C. and preferably less than about 5° C. It is preferable that the polymer crystallizes rapidly. To this end, seeding agents, or crystallization catalysts can be incorporated into the polymer.

After use, the wafer retainer according to the present invention can be readily peeled off the surface of the polishing machine base plate by simply heating the wafer retainer to a temperature (hereinafter referred to as an "elevated temperature") which is slightly higher than the use temperature. The elevated temperature is usually about 40° C. to about 100° C., preferably about 40° C. to about 60° C.

The present invention is based on the finding that it is possible to obtain an adhesive composition whose adhesiveness controllably varies with temperature by mixing a crystallizable polymer of certain physicochemical properties with a pressure-sensitive adhesive.

The most preferable side-chain crystallizable polymer to be used according to the present invention contains repeating units of the formula below:

(I)

In formula (I), W and X represent first and second monomer units, respectively, each of which may be any molecular moiety connectable to an adjoining molecular moiety (i.e., polymerizable). Y and Z each independently represent a backbone monomer unit which may be any molecular moiety or atom. Each S independently represents a linking group or spacer unit which may optionally be present. Cyt and Cy each independently represent a crystallizable moiety which is connected to the respective backbone either directly or via the spacer unit. Variables a, b, c, and d each independently represent an integer in the range of 0 to 1,000 with the proviso that sufficient Cyt and Cy are present so as to provide a molecular weight which is equal to or greater than twice the sum of the molecular weights of W, X, Y and Z. The polymers have a heat of fusion ($\Delta Hf$) of at least about 20 Joules/g. In the case where variables a, b, c, and d are all greater than 1, monomer units W, X, Y, and Z each define a repeating unit or a mixture of different monomer units. For example, in the case where a is 100, W may be a 5:5:2:5:83 mixture of styrene, acrylic acid, methylstyrene, and hexadecylacrylate. Accordingly, any of monomer units W, X, Y, and Z may be a mixture of polymerizable monomers.

The adhesive composition according to the present invention may optionally be cross-linked. Cross-linking may be effected by any known technique, such as using a cross-linking agent, heating, or radiation.

The backbone of the polymer (represented as W, X, Y, and Z in formula (I)) may be any organic structure (aliphatic or aromatic hydrocarbon, ester, ether, amide, etc.) or an inorganic structure (sulfide, phosphazine, silicone, etc.). The spacer linkages can be any suitable organic or inorganic units, for example, ester, amide, hydrocarbon, phenyl, ether, or inorganic salt (e.g., a carboxyl-alkyl ammonium or sulphonium or phosphonium ion pair, or other known ionic salt pair). The side-chain (represented as Cyt and Cy, and an optionally present S in formula (I)) may be aliphatic or aromatic, or a combination of aliphatic side-chains of at least 10 carbon atoms, fluorinated aliphatic side-chains of at least 6 carbon atoms, and p-alkyl styrene side-chains wherein the alkyl group contains 8 to 24 carbon atoms.

The length of each side-chain moiety is usually greater than about 5 times the distance between side-chains in the case of acrylates, methacrylates, vinyl esters, acrylamides, methacrylamides, vinyl ethers, and alpha olefins. In the extreme case of a fluoroacrylate alternate copolymer with butadiene, a side-chain can be as little as 2 times the length of the distance between branches. In any case, the side-chain unit should account for more than about 50% of the volume of the polymer, preferably greater than about 65% of the volume. Co-monomers added to a side-chain polymer usually have an adverse effect on crystallinity. Small amounts (usually about 10% to about 25% by volume) of various comonomers can be tolerated. In some cases, it may be preferable to add a small amount of comonomer, e.g., a cure site monomer such as acrylic acid, glycidal methacrylate, maleic anhydride, an amino functional monomer, and the like.

Examples of side-chain crystallizable monomers which fall within the above-described categories include acrylate, fluoroacrylate, methacrylate and vinyl ester polymers such as those described in J. Poly. Sci. 10: 3347 (1972); J. Poly. Sci. 10: 1657 (1972); J. Poly. Sci. 9: 3367 (1971); J. Poly. Sci. 9: 3349 (1971); J. Poly. Sci. 9: 1835 (1971); J.A.C.S. 76: 6280 (1954); J. Poly. Sci. 7: 3053 (1969); J. Poly. Sci. 17: 991 (1985), corresponding acrylamides, substituted acrylamide and maleimide polymers (J. Poly. Sci.: Poly. Physics Ed. 18: 2197 (1980); poly($\alpha$-olefin) polymers such as those described in J. Poly. Sci.: Macromol. Rev. 8: 117–252 (1974) and Macromolecules 13: 12 (1980), polyalkyl-vinylethers, polyalkylethylene oxides such as those described in Macromolecules 13: 15 (1980), alkylphosphazene polymers, polyamino acids such as those described in J. Poly. Sci. USSR 21: 241 (1979), Macromolecules 18: 2141(1985), polyisocyanates such as those described in Macromolecules 12: 94 (1979), polyurethanes made by reacting amine- or alcohol-containing monomers with long-chain alkyl isocyanates, polyesters and polyethers, polysiloxanes and polysilanes such as those described in Macromolecules 19: 611 (1986), and p-alkylstyrene polymers such as those described in J.A.C.S. 75: 3326 (1953), and triglycerides such as tristearin or pentaerythritol tetrastearate.

Particularly preferable side-chain crystallizable polymers to be used for the present invention include linear aliphatic C14–C50 (having 14 to 50 carbon atoms) polyacrylates, linear aliphatic C14–C50 polymethacrylates, linear aliphatic C14–C50 polyacrylamides, and linear aliphatic C14–C50 polymethacrylamides. Especially preferable among these are linear aliphatic C16–C22 polyacrylates, linear aliphatic C16–C22 polymethacrylates, linear aliphatic C16–C22 polyacrylamides, and linear aliphatic C16–C22 polymethacrylamides.

As described above, the melting point of the selected crystallizable polymer defines a use temperature range, within which the composition exhibits tackiness. The amount of the crystallizable polymer incorporated in the adhesive composition has surprisingly little effect on the position or the breadth of this range.

The transition temperatures of some selected side-chain crystallizable polymers are listed below:

| polymer | transitian temperature (° C.) |
| --- | --- |
| C16 acrylate | 36 |
| C16 methacrylate | 26 |
| C18 acrylate | 49 |
| C18 methacrylate | 39 |
| C20 acrylate | 60 |
| C20 methacrylate | 50 |
| C22 acrylate | 71 |
| C22 methacrylate | 62 |

See E. F. Jordan et al. "SIDE-CHAIN CRYSTALLIZATION DEGREE II", J. Poly. Sci. Section A-1, 9: 33551 (1971). Examples in this literature describe a method for producing a crystallizable polymer in detail.

The molecular weight of the crystallizable polymer to be used is an important factor that determines the manner in which the adhesive composition of the present invention exhibits temperature-dependent tackiness and/or adhesion strength. Specifically, a low molecular weight crystallizable polymer will advantageously lose bonding strength when heated. If such property is desirable, the molecular weight of the polymer is preferably in the range of 2,000 to 15,000, and more preferably in the range of 3,000 to 10,000.

The adhesive compositions useful for the present invention may contain, in addition to one or more of the polymers described above, conventional additives such as tackifiers (wood rosin, polyesters, etc.), antioxidants, fibrous or non-fibrous fillers, colorants, and the like. It is also possible to include additional adhesives in the adhesive composition so long as the overall temperature sensitivity profile is not significantly affected thereby. The amount of crystallizable polymer in the adhesive composition is preferably in the range of about 1% by weight to about 30% by weight, more preferably in the range of about 5% by weight to about 20% by weight, and in particular in the range of about 5% by weight to about 15% by weight. If the polymer content in the adhesive composition is less than about 1% by weight or more than about 30% by weight, the above-described effects of the polymer may not be exhibited.

The adhesive compositions of the present invention may be prepared by admixing a pressure-sensitive adhesive and a crystallizable polymer in a compatible solvent and adding optional components thereto, e.g., a plasticizer, a tackifier, and/or a filler. The solid contents are adjusted to the desired viscosity, and the mixture is blended until it is homogeneous. After blending, bubbles are removed from the mixture.

Examples of tackifiers include special rosin ester type tackifiers, terpene phenol type tackifiers, petroleum resin type tackifiers, high hydroxyl value rosin ester type tackifiers, hydrogenated rosin ester type tackifiers, and the like. Examples of commercial products include a special rosin ester type tackifier designated Super Ester A125 (Arakawa Chemical K.K.), a terpene phenol type tackifier designated Tamanoru 803L (Arakawa Chemical K.K.), a petroleum resin type tackifier designated Hiresin #90S (Toho Chemical Industry Co. Ltd.), a high hydroxyl value rosin ester type tackifier designated KE-364C (Arakawa Chemical K.K.), and a hydrogenated rosin ester type tackifier designated Estergum HD (Arakawa Chemical K.K.).

Particularly preferable are, special rosin ester type tackifiers. The amount of a tackifier to be added is preferably in the range of about 10% to about 30% by weight, more preferably about 15% to about 25%, based on the adhesive composition. If the tackifier content is less than about 10% by weight, sufficient adhesion strength may not be attained at ordinary temperatures. If the tackifier content is more than about 30% by weight, the rate of decrease of adhesion strength may not be sufficient at the time of peeling.

Preferable examples of a polymer contained in the adhesive composition include the following:

(1) a copolymer of 80 to 98 parts by weight of stearyl acrylate, 2 to 20 parts by weight of acrylic acid, and 2 to 10 parts by weight of dodecylmercaptan;

(2) a copolymer of 5 to 90 parts by weight of dococyl. acrylate, 5 to 90 parts by weight of stearyl acrylate, 1 to 10 parts by weight of acrylic acid, and 2 to 10 parts by weight of dodecylmercaptan: and (3) a copolymer of 80 to 98 parts by weight of dococyl acrylate, 2 to 20 parts by weight of acrylic acid, and 2 to 10 parts by weight of dodecylmercaptan.

Examples of pressure-sensitive adhesives to be contained in the adhesive composition include a copolymer containing 80 to 95 parts by weight of 2-ethylhexyl acrylate and 5 to 20 parts by weight of 2-hydroxyethyl acrylate.

A number of methods can be used to provide the adhesive layers on a support (or wafer retention layer), e.g., spray deposition, painting, dipping, gravure printing, rolling or the like. The adhesive layers may also be transferred from a release sheet, as in the manner of transfer printing. The composition may be applied neat (i.e., without anything else), or in a suitable solvent, or as an emulsion or latex. Alternatively, a mixture of appropriate monomers and additives may be applied directly to a wafer retention layer and cured in situ by heat, irradiation, or other suitable processes known in the art.

In the case of composing the wafer retainer of four or more layers, the above-described second pressure-sensitive adhesive layer and a first pressure-sensitive adhesive layer (which may be composed of a commercially available adhesive) may be laminated on either face of a support, and a wafer retention layer may be further adhered to the first pressure-sensitive adhesive layer. As the first pressure-sensitive adhesive, the second pressure—sensitive adhesive may be used, for example; however, any other adhesive, in particular a rubber type adhesive, an acrylic type adhesive, or a semi-hotmelt adhesive can be used.

The wafer retainer produced in the above-described manner can be attached to a base plate of a polishing machine as follows. First, the polishing machine base plate is removed and cleaned. At an ordinary temperature (usually about 25° C.), the base plate is placed horizontally, with the face for attaching the wafer retainer facing up. The wafer retainer is taken out from its package (if any), and the release sheet is removed to reveal its adhesive face (i.e., the second pressure-sensitive adhesive layer), which is gently abutted with the base plate surface. It is preferable to slightly warp the wafer retainer and gently place it on the base plate so that its central portion contacts the base plate first. Thereafter, a uniform pressure is applied from above on the entire surface of the wafer retainer thus situated. Although any pressing method may be employed, the press force is preferably equal to or smaller than 1 kg/cm². A pressing method may be adopted which involves pressing the wafer retainer with a flat plate while interposing a sufficient thickness of elastic material between the wafer retainer and the flat plate. Most preferably, a plastic sheet may be employed to cover the wafer retainer situated as described above, and thereafter the space under the plastic sheet may be vacuumed to attain a negative pressure.

As a result, the adhesive layer on the back face of the wafer retainer develops intimacy with the base plate face for close contact. A tack strength on the order of 2 to 3 kg/inch width would exist when the wafer retainer thus attached to a polishing machine base plate were to be detached in a usual manner.

After attaching the wafer retainer on a polishing machine base plate in any of the above-described manners, the base plate carrying the wafer retainer attached thereto may be heated to an elevated temperature above about 50° C., for example.

Following heating methods can be used, for example:
(1) Methods for Heating the Wafer Retainer Surface These methods may involve application of a heated iron, hot water, a heater sheet, hot air (e.g., from an air heater or a drier), steam, radiofrequency heating, and/or irradiation (infrared or far-infrared) by means of a lamp, for example.
(2) Methods for Applying Heat at the Interface Between the Wafer Retainer and the Base Plate These methods may involve application of a heated trowel, a heated iron, hot air (e.g., from an air heater or a drier), hot water, steam, and/or irradiation (infrared or far-infrared) by means of a lamp, for example.

Thereafter, the wafer retainer is peeled off the base plate while heating the wafer retainer. Since the peeling force at the elevated temperature is decreased to about 0.1 to about 0.5 Kg/inch width, the wafer retainer of the present invention can be easily peeled off the base plate surface. The peeling of the wafer retainer may be performed manually.

Hereinafter, the present invention will be specifically described by way of illustrative examples. In the following description, any reference to part (s) means "part(s) by weight".

A. Preparation of Polymer

SYNTHESIS EXAMPLE 1

First, 95 parts of stearyl acrylate, 5 parts of acrylic acid, 5 parts of dodecylmercaptan, and 1 part of Kayaester HP-70 (Kayaku Akzo K.K.) were mixed. The mixture was stirred at about 80° C. for about 5 hours to polymerize these monomers. The resultant polymer had a molecular weight of about 8,000, and a melting point of about 50° C.

SYNTHESIS EXAMPLE 2

First, 95 parts of dococyl acrylate, 5 parts of acrylic acid, 5 parts of dodecylmercaptan, and 1 part of Kayaester HP-70 (Kayaku Akzo K.K.) were mixed. The mixture was stirred at about 80° for about 5 hours to polymerize these monomers. The resultant polymer had a molecular weight of about 8,000, and a melting point of about 60° C.

SYNTHESIS EXAMPLE 3

First, 92 parts of 2-ethylhexyl acrylate, 8 parts of hydroxyethyl acrylate, and 0.3 parts of Trigonox 23-C70 (Kayaku Akzo K.K.) were mixed in 150 parts of ethyl acetate/heptane (70/30). The mixture was stirred at 55° C. for 3 hours and heated to about 80° C. , and 0.5 parts of Kayaester HP-70was added. The mixture was stirred for about 2 hours to polymerize these monomers. The resultant polymer had a molecular weight of about 600,000.

B. Preparation of a Wafer Retainer with a Double-sided Adhesive Tape

EXAMPLE 1

Figure 1:
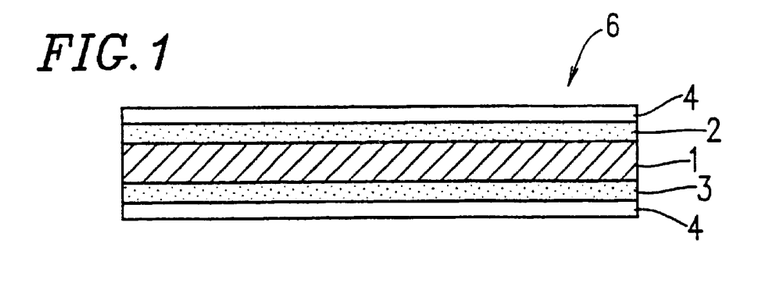
FIG. 1 is a cross-sectional view illustrating a double-sided adhesive tape used for producing a wafer retainer according to the present invention.

The polymers obtained in accordance with Synthesis Examples 1 and 3 were mixed at a ratio of 10:100 parts. To the resultant polymer solution, a cross-linking agent designated Coronate L45 (Nippon Polyurethane Industry Co., Ltd.) was added so that 0.3 parts of Coronate L45 was present against 100 parts of the polymer of Synthesis Example 3. As shown in FIG. 1, the resultant mixture was coated on one face of a support 1 (a PET film manufactured by Somar Co.) so as to have a thickness of about 40 μm, thereby forming an adhesive layer 3. On the other face of the support 1, a rubber type pressure-sensitive adhesive designated G5109A (NO-TAPE Industrial Co., Ltd.) was coated so as to have a thickness of about 40 μm, thereby forming a pressure-sensitive adhesive 2. Thus, a double-sided adhesive tape was produced. Furthermore, release sheets 4 were laminated on the adhesive layers 2 and 3 to give a double-sided adhesive tape 6 with release lining as shown in FIG. 1.

Figure 5:
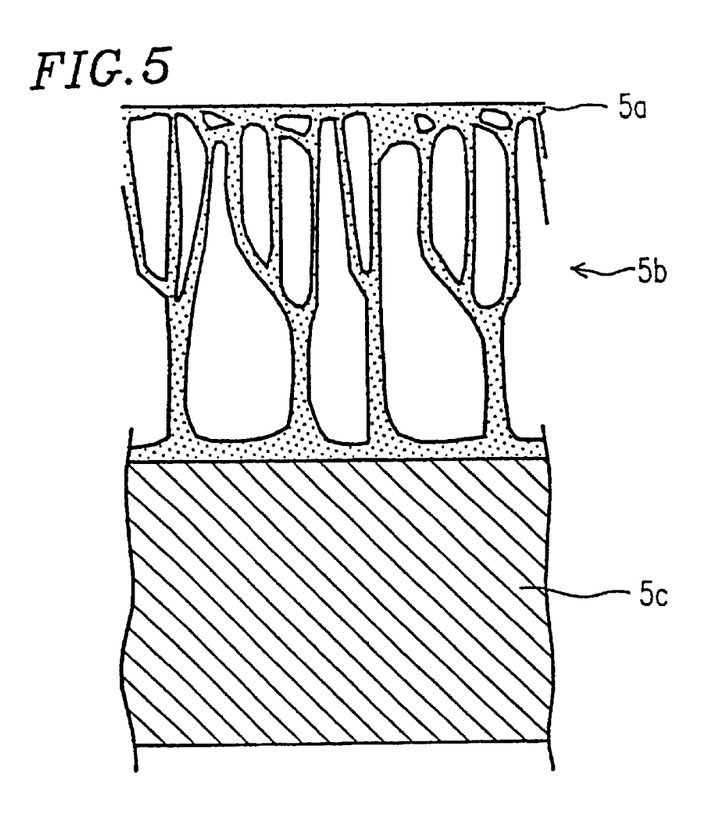
FIG. 5 is a cross-sectional view illustrating a backing film.

As shown in FIG. 5, a mixture I (as described in Table 3) was coated on a polyester film 5c (Lumirror manufactured by Toray Industries, Inc.; having a thickness of about 188 μm) so as to have a thickness of about 700 μm, and was subjected to a wet solidification method to form a foam layer 5b. The resultant composite was subjected to washing and drying to give a backing film. The outermost 100 μm (indicated as Sa in FIG. 5) of this backing film was ground to give the backing film shown in FIG. 6.

Figure 6:
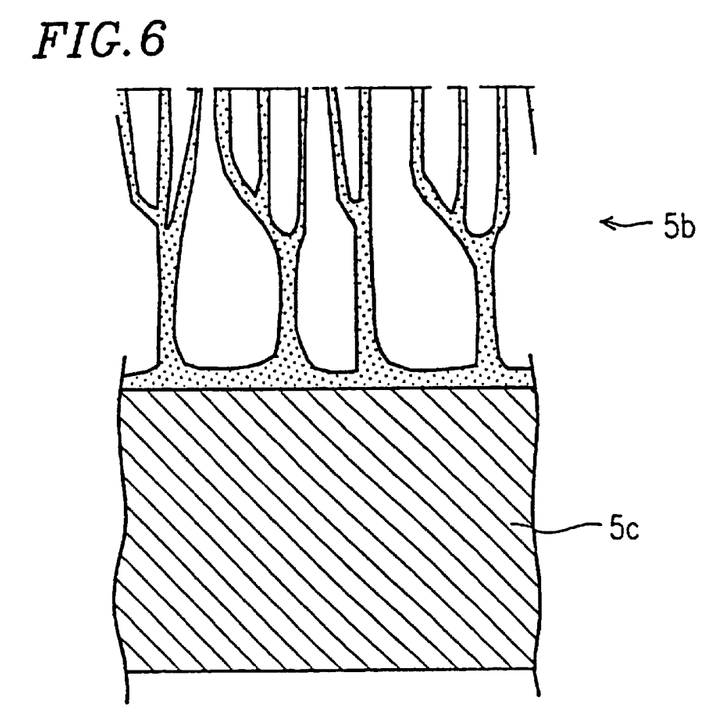
FIG. 6 is a cross-sectional view illustrating a buffed state of the surface layer of a foam layer of the backing film shown in FIG. 5.
Figure 7:
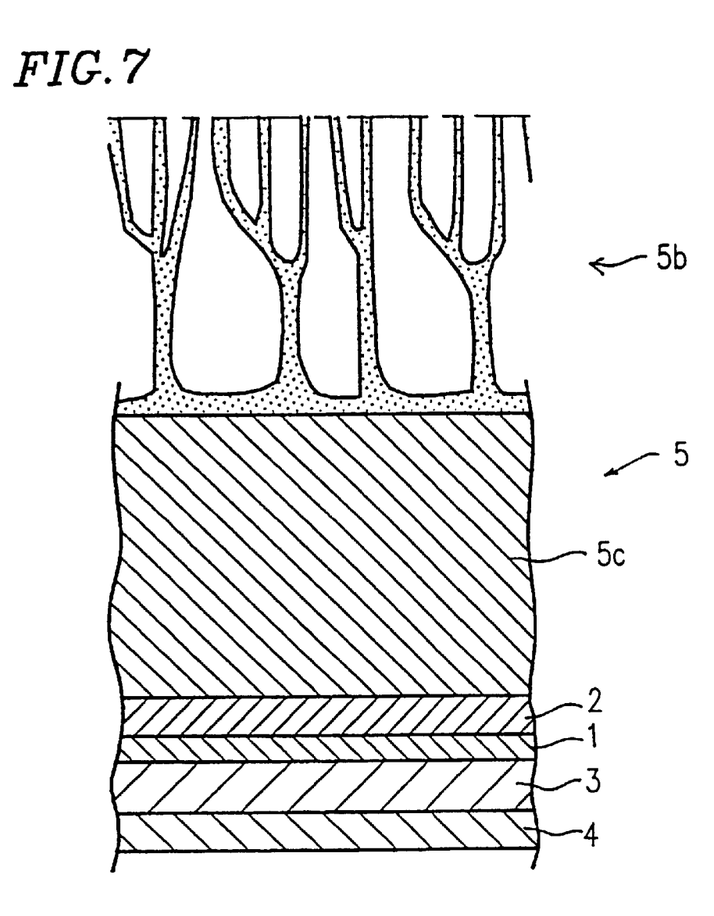
FIG. 7 is a cross-sectional view illustrating a backing film with a double-sided adhesive tape according to the present invention.

The double-sided adhesive tape 6 was attached to the polyester film 5a of the backing film to give a backing film 5 with a double-sided adhesive tape.

Next, the backing film 5 with a double-sided adhesive tape was cut into a piece having a diameter of about 485 mm. A template 30 having recesses for positioning or retaining a wafer in place was attached on the backing film 5 by means of a press, thereby producing a wafer retainer 7 with a double-sided adhesive tape as shown in FIG. 2A. The template 30 used herein was a piece of glass epoxy having an outer diameter of about 485 mm provided with seven 6-inch pockets, with an adhesive and a release sheet on one face.

Figure 3:
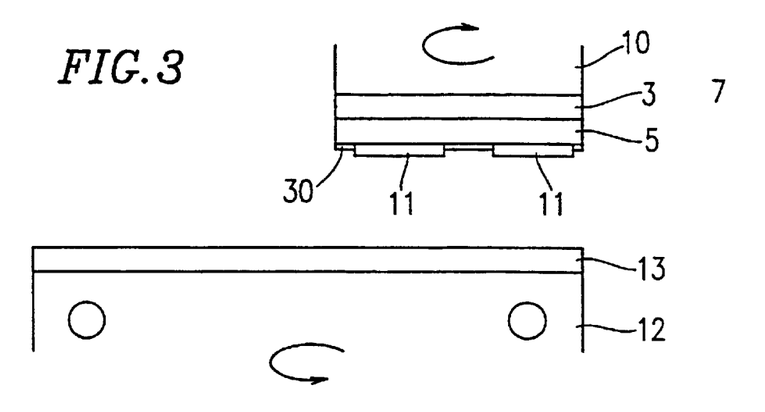
FIG. 3 is a cross-sectional view illustrating a wafer retainer according to the present invention being attached to an upper base plate of a polishing machine.
Figure 4:
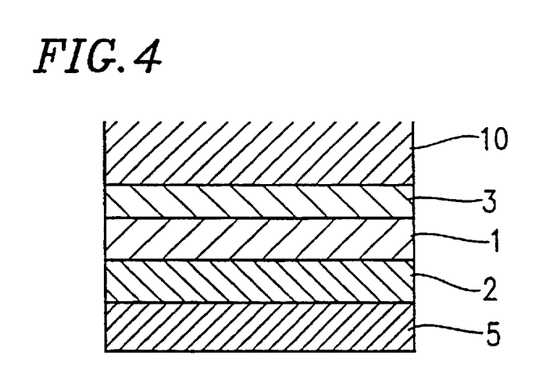
FIG. 4 is a cross-sectional view illustrating an essential portion of FIG. 3.

Next, as shown in FIG. 3, the release sheet 4 on the wafer retainer 7 (FIG. 2A) was peeled, and thereafter the pressure-sensitive adhesive layer 3 was attached to an upper base plate 10 of a polishing machine, thereby lightly attaching the wafer retainer 7 to the upper base plate. Thereafter, a quartz flat (weight: 10 kg; outer diameter: 485 mm) was uniformly placed on the wafer retainer 7, and left for about 30 minutes to develop intimacy between the adhesive and the upper base plate 10. The adhesion temperature was about 25° C. In FIG. 3, reference numeral 11 denotes a wafer; 12 denotes a lower base plate; and 13 denotes a polishing cloth attached on the lower base plate 12.

Next, the wafer retainer was evaluated by using a single-side polishing machine (SPM-19, manufactured by Fujikoshi Kikai). Wafers 11 of silicon monocrystal P (100) (diameter: 6 inches) were subjected to a polishing under the polishing conditions described in Table 4. Specifically, fifty times of polishing (about 30 minutes each time) were repetitively performed.

After the wafer retainer 7 was used in the above-mentioned manner, the upper base plate 10 was immersed in hot water at about 60° C., and the wafer retainer 7 was peeled off the upper base plate after the lapse of about 10 minutes. The wafer retainer 7 easily peeled with a maximum peeling force of about 3 Kg.

After the adhesive layer 3 of the wafer retainer 7 was once attached to the upper base plate of the polishing machine, it was possible to easily reposition and reattach the wafer retainer 7 by heating above about 60° C.

EXAMPLES 2 TO 4

A wafer retainer with a double-sided adhesive tape was produced in the same manner as in Example 1 except that Superester A125 (Arakawa Chemical K.K.) was added as a tackifier in the amount of about 10% by weight (Example 2), about 20% by weight (Example 3), or about 30% by weight (Example 4), based on the polymer of Synthesis Example 3.

Next, the same polishing test as that in Example 1 was conducted, whereafter each wafer retainer was peeled. Each wafer retainer easily peeled with a maximum peeling force of about 3.5 Kg.

Table 2 shows the added amounts of Superester A125, the peeling forces at an ordinary temperature (about 23° C.) and at an elevated temperature (about 60° C.), and the rate of decrease of the peeling force from the value exhibited at the elevated temperature relative to the value exhibited at the ordinary temperature.

EXAMPLES 5 TO 8

A wafer retainer with a double-sided adhesive tape was produced in the same manner as in Example 1 except that the polymers of Synthesis Examples 2 and 3 were mixed at the ratio of about 10:100 parts and that Superester A125 (Arakawa Chemical K.K.) was added as a tackifier in the amount of about 0% by weight (Example 5), about 10% by weight (Example 6), about 20% by weight (Example 7), or about 30% by weight (Example 8), based on the polymer of Synthesis Example 3.

Next, the same polishing test as that in Example 1 was conducted, whereafter each wafer retainer was peeled. Table 2 shows the added amounts of Superester A125, the peeling forces at an ordinary temperature (about 23° C.) and at an elevated temperature (about 70° C.), and the rate of decrease of the peeling force from the value exhibited at the elevated temperature relative to the value exhibited at the ordinary temperature.

EXAMPLE 9

A wafer retainer with a double-sided adhesive tape was produced in the same manner as in Example 1 except that an acrylic type adhesive (R5542 manufactured by Ipposha Oil Industry Co., Ltd) was used as a commercially available pressure-sensitive adhesive.

Next, the same polishing test as that in Example 1 was conducted, whereafter each wafer retainer was peeled. Table 2 shows the peeling forces at an ordinary temperature (about 23° C.) and at an elevated temperature (about 60° C.), and the rate of decrease of the peeling force from the value exhibited at the elevated temperature relative to that exhibited at the ordinary temperature.

EXAMPLE 10

A wafer retainer with a double-sided adhesive tape was produced in the same manner as in Example 1 except that an acrylic type pressure-sensitive adhesive (AR-2108M-1, manufactured by RIKIDYNE Co., Ltd.) was used as a commercially available pressure-sensitive adhesive.

Next, the same polishing test as that in Example 1 was conducted, whereafter each wafer retainer was peeled. Table 2 shows the peeling forces at an ordinary temperature (about 23° C.) and at an elevated temperature (about 60° C.), and the rate of decrease of the peeling force from the value exhibited at the elevated temperature relative to that exhibited at the ordinary temperature.

COMPARATIVE EXAMPLE

A wafer retainer with a double-sided adhesive tape was produced in the same manner as in Example 1 except that a commercially available double-sided adhesive tape (ST442 manufactured by Sumitomo 3M Ltd.) was attached on the polyester film 5c of the backing film. Next, the wafer retainer was evaluated by using a single-side polishing machine (SPM-19, manufactured by Fujikoshi Kikai) in the same manner as in Example 1.

Wafers of silicon monocrystal P (100) (diameter: 6 inches) were subjected to a polishing under the polishing conditions described in Table 4. Specifically, fifty times of polishing (about 30 minutes each time) were repetitively performed. After the wafer retainer was used in the above-mentioned manner, the wafer retainer was detached from the ceramic upper base plate. The wafer retainer required a maximum peeling force of about 40 Kg, and therefore was not easy to peel off. The peeling force required at an elevated temperature was about 30 Kg at maximum.

TABLE 1

| | |
|---|---|
| Polishing machine | Speed fam Single-side polishing machine (59SPAW) with a base plate (diameter: 59 inches) |
| Wafer to be processed | Silicon monocrystal P (100) wafer (diameter: 8 inches) |
| Wafer retainer | SUBA800 |
| Polishing slurry | NALCO2350; diluted by 20 times (manufactured by Nalco Chemical Company) |
| Processing pressure | 300 g/cm$^2$ |
| Slurry flow rate | 1000 ml/min. |
| Processing time | 30 min. |

TABLE 2

| | Added amount (wt. %) | Peeling Force 23° C. | Peeling Force 60° C. | Peeling Force 70° C. | Rate of decrease (%) |
|---|---|---|---|---|---|
| Example 1 | 0 | 30 | 3 | | 90 |
| Example 2 | 10 | 33 | 3.5 | | 89 |
| Example 3 | 20 | 42 | 3.5 | | 92 |
| Example 4 | 30 | 45 | 3.5 | | 92 |
| Example 5 | 0 | 28 | | 3 | 89 |
| Example 6 | 10 | 33 | | 3.5 | 89 |
| Example 7 | 20 | 40 | | 3.5 | 91 |
| Example 8 | 30 | 43 | | 3.5 | 92 |
| Example 9 | 0 | 30 | 3 | | 90 |
| Example 10 | 0 | 30 | 3 | | 90 |
| Comparative Example | — | 40 | | 30 | 25 |

TABLE 3

| | |
|---|---|
| Ester-type polyurethane (CRISVON-7667; manufactured by Dainippon Ink and Chemicals, Inc.) | 100 phr |
| dimethylformamide (manufactured by Nitto Chemical Industry Co., Ltd.) | 50 phr |
| pigment (DILAC-5442; manufactured by Dainippon Ink and Chemicals, Inc.) | 20 phr |
| surfactant (K ASSISTOR SD-7; manufactured by Dainippon Ink and Chemicals, Inc.) | 3 phr |

TABLE 4

| | |
|---|---|
| Polishing machine | Single-side polishing machine (SPM-19; manufactured by Fujikoshi Kikai) with a carrier plate (diameter: 485 mm) |
| Wafer to be processed | Silicon monocrystal P (100) wafer (diameter: 6 inches) |
| Polishing cloth | SUBA 800 |
| Polishing slurry | NALCO2350; diluted by 20 times |
| Processing pressure | 300 g/cm$^2$ |
| Slurry flow rate | 500 ml/min. |
| Processing time | 30 min. |

INDUSTRIAL APPLICABILITY

The exchanging or replacement of a wafer retainer according to the present invention, conducted after each polishing process, is facilitated because the wafer retainer can be easily peeled off a base plate surface simply by heating the base plate and/or the adhesive layer of the wafer retainer.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A wafer retainer comprising:

a foam layer capable of adsorbing a wafer on a surface thereof in a detachable manner;

a first pressure-sensitive adhesive layer formed on a back face of the foam layer;

a support formed on a back face of the first pressure-sensitive adhesive layer;

a second pressure-sensitive adhesive layer formed on a back face of the support for adhering to a base plate of a polishing machine; and a release sheet releasably attached to the second pressure-sensitive adhesive layer, wherein the second pressure-sensitive adhesive layer comprises an adhesive composition, the adhesive composition containing a pressure-sensitive adhesive and a side-chain crystallizable polymer so that the side-chain crystallizable polymer is present in an amount of about 1% to about 30% by weight based on the adhesive composition, and the side-chain crystallizable polymer including as a main component thereof an acrylic acid ester and/or methacrylic acid ester which has a straight-chain alkyl group including 16 or more carbon atoms as a side chain, wherein the adhesive composition contains a tackifier in an amount of about 10% to about 30% by weight, wherein the side-chain crystallizable polymer has a molecular weight of about 2,000 to about 15,000, and wherein adhesiveness of the adhesive composition, measured by a peeling force, is decreased by more than about 90% when heated above about 50° C., with respect to the adhesiveness when measured at 23° C.

2. A wafer retainer comprising:

a wafer retention layer capable of adsorbing a wafer on a surface thereof in a detachable manner;

a pressure-sensitive adhesive layer for attaching the wafer retention layer to a base plate of a polishing machine; and a release sheet releasably attached to the pressure-sensitive adhesive layer, wherein the pressure-sensitive adhesive layer comprises an adhesive composition, the adhesive composition containing a pressure-sensitive adhesive and a side-chain crystallizable polymer so that the side-chain crystallizable polymer is present in an amount of about 1% to about 30% by weight based on the adhesive composition, and the side-chain crystallizable polymer including as a main component thereof an acrylic acid ester and/or methacrylic acid ester which has a straight-chain alkyl group including 16 or more carbon atoms as a side chain, wherein the adhesive composition contains a tackifier in an amount of about 10% to about 30% by weight, wherein the side-chain crystallizable polymer has a molecular weight of about 2,000 to about 15,000, and wherein adhesiveness of the adhesive composition, measured by a peeling force, is decreased by more than about 90% when heated above about 50° C., with respect to the adhesiveness when measured at 23° C.

* * * * *

UNITED STATES PATENT AND TRADEMARK OFFICE
CERTIFICATE OF CORRECTION

PATENT NO. : 6,666,752 B1
DATED : December 23, 2003
INVENTOR(S) : Yamamoto et al.

It is certified that error appears in the above-identified patent and that said Letters Patent is hereby corrected as shown below:

Column 3,
Line 36, change "drastic a" to -- a drastic --;

Column 5,
Line 41, change "the-polymer" to -- the polymer --;

Column 7,
Line 56, in table, change "transitian" to -- transition --;

Column 8,
Line 50, delete "," after "are";

Column 10,
Line 17, change "part (s)" to -- "part(s)" --;

Column 11,
Line 8, cahnge "Sa" to -- 5a --;
Line 11, change "5a" to -- 5c --;

Signed and Sealed this

Third Day of August, 2004

JON W. DUDAS
*Acting Director of the United States Patent and Trademark Office*